(12) United States Patent
Turullols et al.

(10) Patent No.: US 7,333,468 B1
(45) Date of Patent: Feb. 19, 2008

(54) DIGITAL PHASE LOCKED LOOPS FOR PACKET STREAM RATE MATCHING AND RESTAMPING

(75) Inventors: Sebastian Turullols, Los Altos, CA (US); Aly E. Orady, Sunnyvale, CA (US); James J. Yu, San Jose, CA (US); Andrew C. Yang, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 442 days.

(21) Appl. No.: 11/129,798

(22) Filed: May 16, 2005

(51) Int. Cl.
*H04J 3/24* (2006.01)
*H04J 3/06* (2006.01)
*H04L 12/56* (2006.01)
*H04L 7/00* (2006.01)
*H04L 7/04* (2006.01)
*H04L 9/00* (2006.01)
*H04B 1/18* (2006.01)
*H04B 1/10* (2006.01)

(52) U.S. Cl. .................. 370/349; 370/350; 370/395.62; 370/509; 370/514; 455/180.3; 455/181.1; 455/183.2; 375/357; 375/366; 375/362; 375/350; 375/355; 713/178

(58) Field of Classification Search ........... 370/395.62, 370/310, 324, 328, 330, 338, 503, 349–350, 370/509–522, 473, 902, 912–913; 375/240.28, 375/350, 355, 357, 362, 364, 366, 368; 702/89, 702/125, 176, 187; 713/178, 375, 400, 500, 713/501, 503; 455/62, 63.1, 179.1, 180.1, 455/180.2, 180.3, 181.1, 183.2, 502, 516, 455/550.1, 556.2
See application file for complete search history.

(56) References Cited

U.S. PATENT DOCUMENTS 5,287,182 A * 2/1994 Haskell et al. .............. 348/500

(Continued)

FOREIGN PATENT DOCUMENTS

EP          0 577 329 A1 *  1/1994

OTHER PUBLICATIONS

"DTA-120—DVB/ASI Input Adapter for PCI Bus"; Data Sheet; Jul. 2003; 30 pages; DekTec Digital Video B.V.; Retrieved from the Internet: http://www.dektec.com/Products/DTA-120/Downloads/DTA-120.pdf.

(Continued)

*Primary Examiner*—Meless Zewdu
(74) *Attorney, Agent, or Firm*—Meyertons Hood Kivlin Kowert & Goetzel, P.C.; Jeffrey C. Hood; Mark K. Brightwell

(57) ABSTRACT

A packet stream multiplexer may include one or more control loops (e.g., digital phase locked loops) for tracking the source clock frequency associated with a packet stream. A first control loop may slowly drive an error between a received timestamp and an estimated timestamp to zero. A second control loop may more quickly drive a first derivative of the error to zero. The second control loop may include a set of digital filters ordered according to tracking speed. The output of the slowest filter is initially selected for updating the source clock frequency estimate. As time progresses, the faster filters are selected in succession. The estimated source clock frequency is used to restamp packets of the packet stream as they are sent out onto an output channel.

21 Claims, 6 Drawing Sheets

U.S. PATENT DOCUMENTS

| | | | | |
|---|---|---|---|---|
| 5,469,466 | A | * | 11/1995 | Chu .......................... 375/354 |
| 5,553,021 | A | | 9/1996 | Kubono et al. |
| 6,278,710 | B1 | * | 8/2001 | Eidson ....................... 370/394 |
| 6,754,241 | B1 | | 6/2004 | Krishnamurthy et al. |
| 6,760,395 | B1 | * | 7/2004 | Bonello et al. ............. 375/376 |
| 6,996,155 | B2 | * | 2/2006 | Kanterakis et al. ......... 370/445 |
| 7,130,368 | B1 | * | 10/2006 | Aweya et al. ............... 375/376 |
| 2002/0001299 | A1 | * | 1/2002 | Petch et al. ................. 370/350 |
| 2006/0146815 | A1 | * | 7/2006 | Tse ............................. 370/389 |
| 2006/0239393 | A1 | * | 10/2006 | Lai et al. .................... 375/376 |

OTHER PUBLICATIONS

Didier Le Gall; "MPEG: A Video Compression Standard for Multimedia Applications"; Communications of the ACM; Apr. 1991; pp. 47-58; vol. 34, No. 4.

* cited by examiner

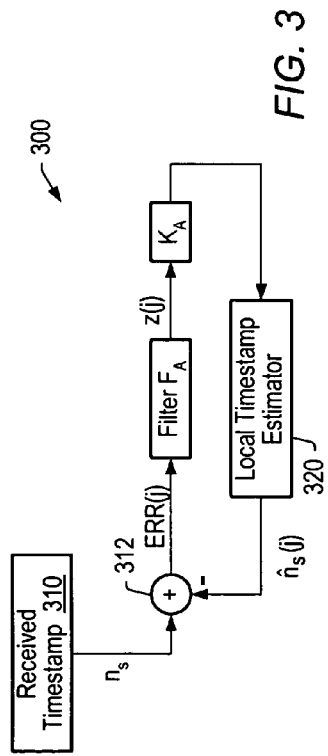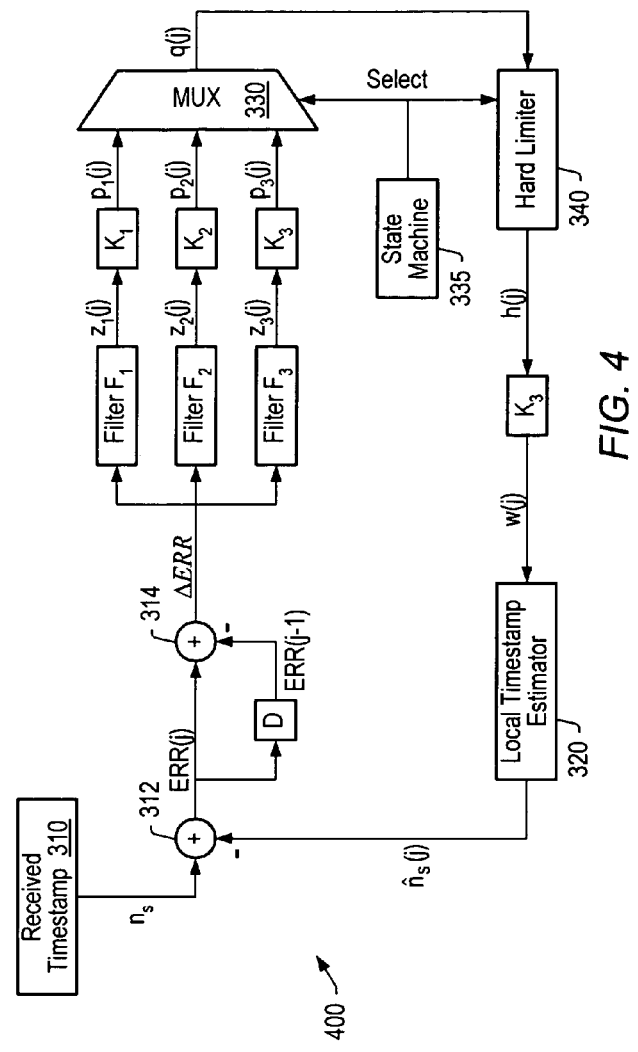

DIGITAL PHASE LOCKED LOOPS FOR PACKET STREAM RATE MATCHING AND RESTAMPING

BACKGROUND OF THE INVENTION

1. Field of the Invention

This invention is related to the field of digital data multiplexing, and, more particularly, to the field of phase locked loop design.

2. Description of the Related Art

A digital source device may generate a stream of packets for transmission to a digital sink device. The packets may contain information that requires action by the sink device at certain times. Thus, the source device may embed timestamps into the packet stream so that the sink device can synchronize with the clock in the source device. However, the transmission time between the source device and the sink device may vary from one packet to the next of the packet stream, especially when the packet stream is multiplexed with other packet streams onto the same channel or data path. The variation in packet transmission time may make it difficult for the sink device to lock onto the source clock frequency associated with the packet stream. Thus, there exists a need for systems and devices capable of operating on the packet stream in a way that minimizes the variation of apparent source clock frequency as seen by the data sink.

SUMMARY

In one set of embodiments, a system may include a timestamp estimator, a summation unit, and a filter $F_A$.

The timestamp estimator may be configured to generate a current timestamp estimate based on an estimate of a source clock frequency associated with a packet stream.

The summation unit may be configured to receive (a) a current received timestamp of the packet stream and (b) the current timestamp estimate, and to compute a current error equal to a difference of the current received timestamp and the current timestamp estimate.

The filter $F_A$ may be configured to filter the current error to obtain a filter output z.

The timestamp estimator may be further configured to compute a first update of the estimate of the source clock frequency based on the filter output value z.

The estimate of the source clock frequency is usable to restamp at least a subset of the packets of the packet stream.

In one embodiment, the system may also include a second summation unit, a set of filters $F_1, F_2, \ldots, F_M$, and a decision multiplexer. The integer M may be any integer greater than one.

The second summation unit may be configured to receive the current error and a previous error, and to compute an error gradient equal to a difference of the current error and the previous error.

The set of filters $F_1, F_2, \ldots, F_M$ may be configured to receive the error gradient and to filter the error gradient to obtain a corresponding filter output value $z_i$.

The decision multiplexer may be configured to select each of the filter output values $z_1, z_2, \ldots, z_M$ during respective periods of time.

The timestamp estimator may be configured to compute a second update to the estimate of the source clock frequency using the selected filter output value. The second update to the source clock frequency estimate may be configured so as to drive the error gradient towards zero.

The filters $F_1, F_2, \ldots, F_M$ may be ordered according to tracking speed. The decision multiplexer may be configured to select the filter output values during the respective periods of time in response to a select input from a state machine. The state machine may drive the decision multiplexer to select the filter output values from the filters $F_1, F_2, \ldots, F_M$ in order from fastest tracking speed to slowest tracking speed.

In some embodiments, the system may also include a state machine configured to count a number of timestamp-bearing packets in the packet stream, to compare the count to an ordered set of threshold values, and to drive the decision multiplexer to select one of the filter output values based on a state of the count relative to the set of threshold values.

A limiter may be employed to limit the selected filter output value to an amplitude range. The size of the amplitude range may decrease in discrete steps corresponding to said respective periods of time.

A multiplier may be configured to scale the selected filter output value. The scaled value is used to perform the second update of the source clock frequency estimate.

In one group of embodiments, the packet stream is an MPEG-2 transport stream, and, the timestamps are program clock reference (PCR) timestamps.

The filter $F_A$ may be an infinite impulse response (IIR) filter. Other types of filters are contemplated as well.

Any or all of the filters of set $\{F_1, F_2, \ldots, F_M\}$ may be IIR filters. Other types of filters are contemplated as well.

In one embodiment, the estimate for the source clock frequency is a normalized estimate for the source clock frequency, as described later herein.

The system may also include a scheduler configured to restamp at least a subset of the packets of the packet stream based on the estimate of the source clock frequency.

In another set of embodiments, a system may include a timestamp estimator, a summation unit, a derivative unit, two or more digital filters and a multiplexer.

The timestamp estimator may be configured to generate a sequence of timestamp estimates based on corresponding sequence of estimates for a frequency of a source clock associated with a packet stream.

The summation unit may be configured to operate on (a) a sequence of received timestamps extracted from packets of the packet stream and (b) the sequence of timestamp estimates to generate a sequence of error values, where each of the error values is a difference between one of the received timestamps and a corresponding one of the timestamp estimates.

The derivative unit may be configured to operate on the sequence of error values to generate a sequence of error gradients (e.g., first order discrete differences in time). For example, the derivative unit may include a summation circuit and a delay unit.

The two or more digital filter circuits may be configured to filter the sequence of error gradients to generate respectively two or more sequences of filter output values.

The multiplexer may be configured to select one of the two or more sequences of filter output values, wherein different ones of the two or more sequences are selected during different periods of time.

The timestamp estimator may be configured to generate the sequence of frequency estimates based on the selected sequence of filter output values.

The sequence of frequency estimates may be used to restamp at least a subset of the packets of the packet stream.

The packet stream may be an MPEG-2 transport stream, and, the timestamps may be program clock reference (PCR) timestamps. Any subset of the two or more digital filters may be IIR filters.

In one embodiment, said estimate for the source clock frequency is a normalized estimate for the source clock frequency, as described later herein.

The system may include a limiter to the limit the values of the selected output sequence. The limited values may then be used to generate the sequence of frequency estimates.

The system may also include a scheduler configured to restamp at least a subset of the packets of the packet stream based on said estimates of the source clock frequency.

The update to the source clock frequency estimate may be configured to drive the error gradient towards zero.

In yet another set of embodiments, a system may include a timestamp estimator, a summation unit, a derivative unit, and a digital filter circuit.

The timestamp estimator may be configured to generate a sequence of timestamp estimates based on corresponding sequence of estimates for a frequency of a source clock associated with a packet stream.

The summation unit may be configured to operate on (a) a sequence of received timestamps extracted from packets of the packet stream and (b) the sequence of timestamp estimates to generate a sequence of error values, wherein each of the error values is a difference between one of the received timestamps and a corresponding one of the timestamp estimates.

The derivative unit may be configured to operate on the sequence of error values to generate a sequence of error gradients. The derivative unit may include a summation circuit (e.g., an adder) and a delay unit.

The digital filter circuit may be configured to filter the sequence of error gradients to generate a sequence of filter output values.

The timestamp estimator may be configured to generate said sequence of frequency estimates based on the sequence of filter output values.

BRIEF DESCRIPTION OF THE FIGURES

The following detailed description makes reference to the accompanying drawings, which are now briefly described.

FIG. 3 illustrates one set of embodiments of an absolute error control loop.

FIG. 4 illustrates one set of embodiments of a derivative error control loop.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning "having the potential to"), rather than the mandatory sense (i.e., meaning "must"). The phrase "A includes B" is to be interpreted as "A includes B, but is not limited to B".

DETAILED DESCRIPTION OF PREFERRED EMBODIMENTS

The following is a list of acronyms used herein.

dB=decibels

FIFO=first-in first-out buffer

FIR=finite impulse response hr=hour

Hz=Hertz (i.e., cycles per second)

IIR=infinite impulse response

MHz=Megahertz

MPEG=moving picture experts group

μs=microseconds ns=nanoseconds

PCR=Program Clock Reference

PLL=phase locked loop ppm=parts per million

SNR=signal-to-noise ratio

Figure 1:
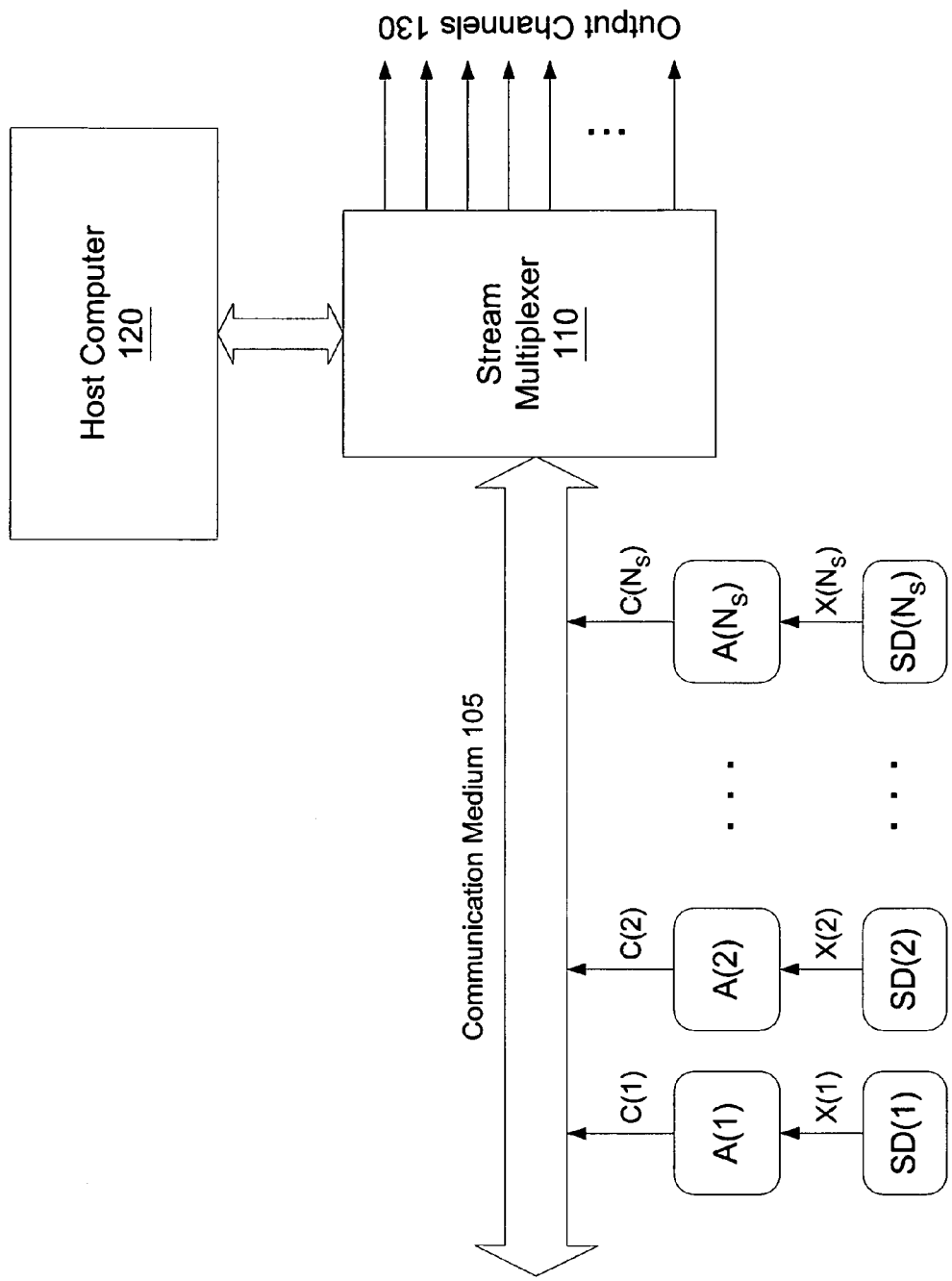
FIG. 1 illustrates a system for distributing packet streams from a set of source devices to a set of output channels.

Source devices SD(1), SD(2), . . . , SD($N_S$), where $N_S$ is a positive integer, may be configured to generate packet streams X(1), X(2), . . . , X($N_S$), respectively, as suggested by FIG. 1.

Each source device SD(k), k=1, 2, . . . , $N_S$, may be configured to inject timestamps into at least a subset of the packets of stream X(k). To support this timestamping operation, each source device SD(k) may include its own source clock and source counter which is driven by the source clock. Source device SD(k) may derive a timestamp for a packet by reading the value of a source counter. Let $f_S(t,k)$ denote the frequency of the source clock in source device SD(k) at time t. This notation acknowledges that the source clock frequency of any given source device SD(k) is not constant but varies with respect to time (e.g., due to temperature variations). Furthermore, the source clocks in the source devices will generally have different frequencies within a specified tolerance, even when the source clocks are designed to have the same nominal frequency.

Source device SD(k), k=1, 2, . . . , $N_S$, may transmit the stream X(k) to a transfer device A(k).

In one set of embodiments, the source devices SD(1), SD(2), . . . SD($N_S$) may be encoders (e.g., MPEG-2 encoders) and the packet streams X(1), X(2), . . . , X($N_S$) may be MPEG-2 transport streams as defined in the ISO/IEC 1381-1 specification for MPEG-2. In these embodiments, the timestamps are referred to as program clock reference (PCR)

timestamps. The transfer devices $A(1), A(2), \ldots, A(N_S)$ may be Ethernet interfaces, however, other types of interfaces may be used as well.

Transfer device $A(k)$ may be configured to:
receive the stream $X(k)$,
embed the packets of the stream $X(k)$ into a sequence $C(k)$ of data units (e.g., Internet Protocol datagrams), and
transfer the sequence $C(k)$ of data units to a stream multiplexer 110 through a communication medium 105.

Each data unit may include a number of packets.

In one set of embodiments, the communication medium 105 is an Ethernet segment (e.g., a 10 Gigabit Ethernet segment). However, it is contemplated that other technologies may be used to realize the communication medium.

The communication medium 105 may be configured according to a protocol that allows only one agent to communicate at any given time. Thus, the stream multiplexer 110 may receive (from the communication medium 105) a composite sequence of data units representing a time-multiplexed mixture of the data units of the sequences $C(1), C(2), C(N_S)$.

The stream multiplexer 110 is configured for coupling to the communication medium 105 and to a set of output channels 130 as illustrated in FIG. 1.

The stream multiplexer 110 buffers, multiplexes, and de-jitters subsets of the streams $X(1), X(2), \ldots, X(N_S)$ onto respective ones of the output channels 130. In other words, a first subset of the streams are combined to form a first output stream which is transmitted onto a first of the output channels; a second subset of the streams are combined to form a second output stream which is transmitted onto a second of the output channels; and so forth.

In one set of embodiments, the output channels 130 are quadrature amplitude modulation (QAM) channels. However, it is contemplated that other technologies may be used to realize the output channels.

Each of the output channels 130 may couple to a number of data sinks (not shown). The data sinks may be (or may include) MPEG-2 decoders.

Each data sink may be configured to (a) receive the multiplexed output stream from the output channel to which it is coupled and (b) extract packets corresponding to one or more selected packets streams from the multiplexed output stream. Furthermore, each data sink may include a phase locked loop (PLL) based in hardware or software. For each of the selected packet streams, the PLL may attempt to track the frequency of the source clock corresponding to the selected packet stream using the timestamps embedded in the selected packet stream. However, if the jitter in the transmission time (between the source device and the data sink) for the selected packet stream is too great, or the transmission frequency is incorrect, the software PLL may not be able to lock onto the source clock frequency. This inability to lock onto the source clock frequency may have adverse effects such as improper decoding or loss of picture. Thus, stream multiplexer 110 may be configured to:
apply a more robust hardware-based methodology for tracking the source clock frequency of each of the streams $X(1), X(2), \ldots, X(N_S)$, and
use the estimated source clock frequencies (which are generated and periodically updated by said hardware-based tracking methodology) to restamp packets as they are being sent out onto the output channels 130.

In some embodiments, the stream multiplexer 110 may be used to supply video on demand to users. For example, a set of users whose decoder boxes are coupled to a given output channel may select respective programs they are interested in viewing from a set of available programs (e.g., movies). The stream multiplexer 110 may be configured to multiplex the streams (e.g., the MPEG-2 transport streams) representing the selected programs onto the given output channel. Each user's decoder box may extract the packets of one or more selected packet streams from the multiplexed output stream and generate one or more video streams from the extracted packets. The video stream may be used to drive a display device (such as a television, a projector, a head mounted display, a computer display, etc.) which is coupled to the decoder box.

The stream multiplexer 110 may be configured for coupling to a host computer 120. The host computer may be configured to execute software that performs control and management functions such as initialization, error reporting, etc.

Figure 2A:
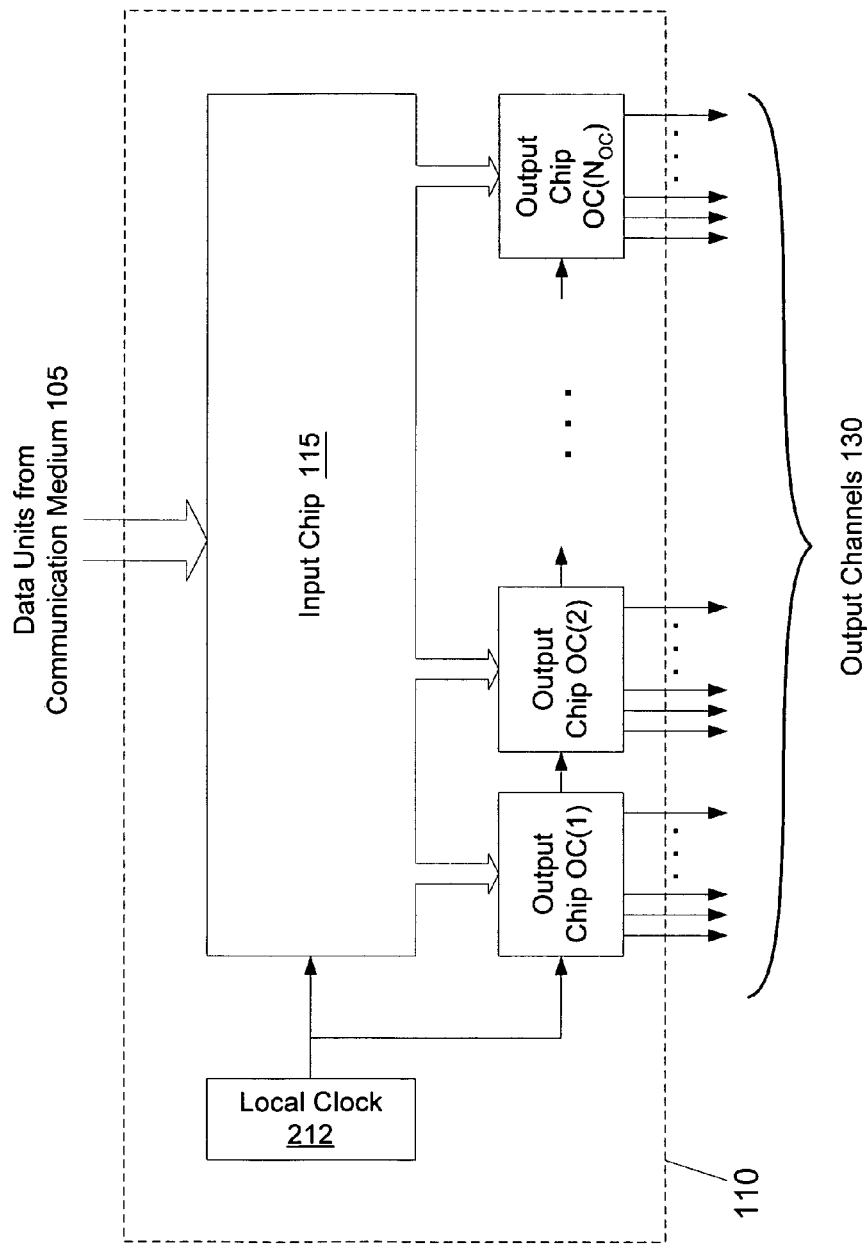
FIG. 2A illustrates one set of embodiments of stream multiplexer 110.

FIG. 2A is a block diagram of the stream multiplexer 110 according to one set of embodiments. The stream multiplexer 110 may include:
an input chip 115,
a set of output chips $OC(1), OC(2), \ldots, OC(N_{OC})$, where $N_{OC}$ is a positive integer, and
a local clock 212.

The number $N_{OC}$ of output chips may vary among different embodiments. In one embodiment, $N_{OC}$ equals 4. In another embodiment, $N_{OC}$ equals 8.

The input chip 115 receives a composite sequence of data units representing a time-multiplexed mixture of the data units of sequences $C(1), C(2), \ldots, C(N_S)$. Furthermore, the input chip 115 extracts packets of the packet streams $X(1), X(2), \ldots, X(N_S)$ from the data units of the composite sequence and transfers each of the packet streams to one or more of the output chips $OC(1), OC(2), \ldots, OC(N_{OC})$. The assignment of packet streams to output chips is programmable (e.g., by a control software executing on host computer 120).

Each output chip $OC(k)$, $k=1, 2, \ldots, N_{OC}$, is configured to receive packets corresponding to one or more of the packet streams $X(1), X(2), \ldots, X(N_S)$ and to transmit each of the received packet streams onto one or more of its output channels. The assignment of packets streams to output channels is programmable (e.g., by the control software executing on host computer 120).

The local clock 212 drives the local counters within the input chip 115 and each of the output chips $OC(1), OC(2), \ldots, OC(N_{OC})$.

Figure 2B:
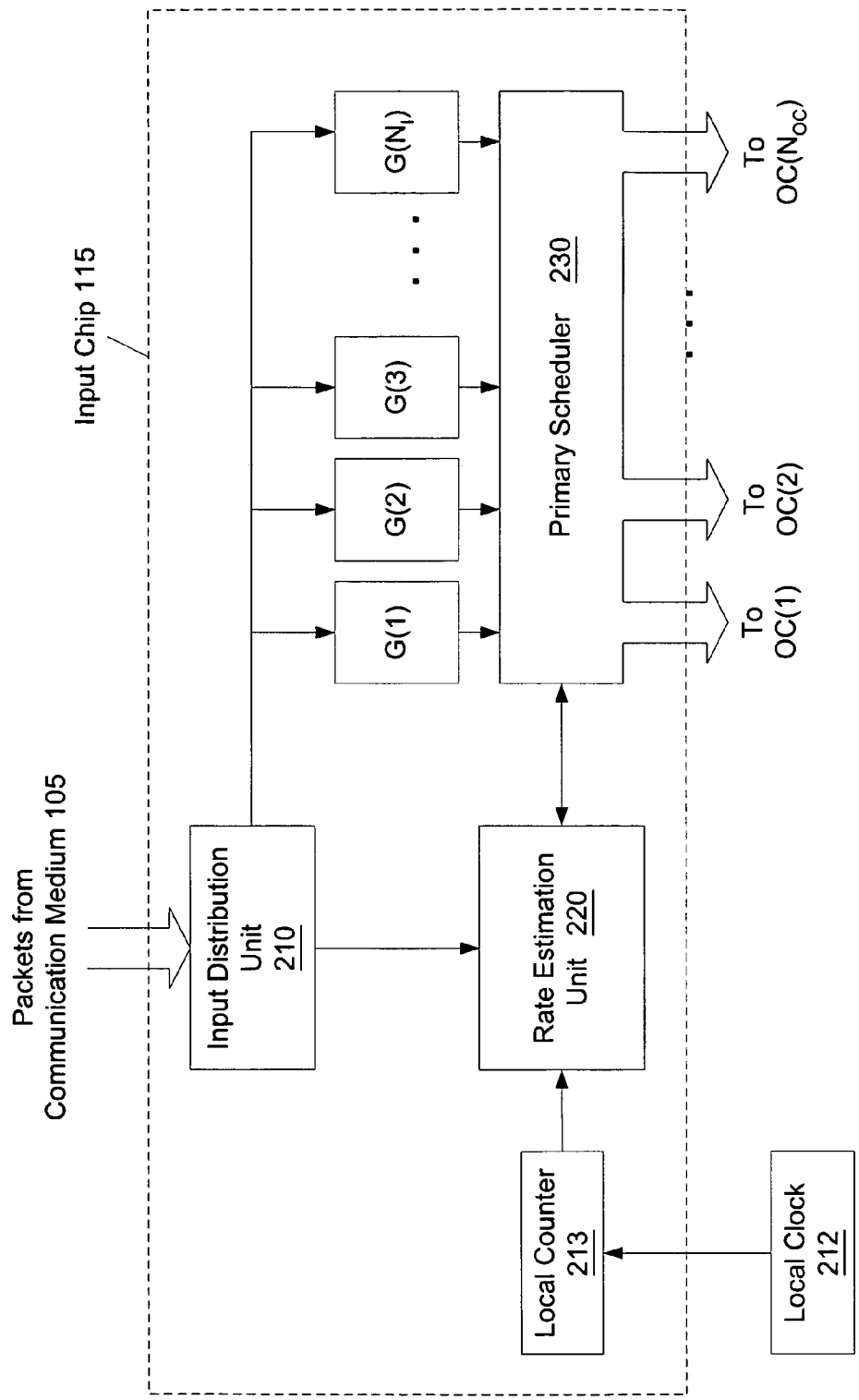
FIG. 2B illustrates one set of embodiments of an input chip of the stream multiplexer 110.

FIG. 2B is a block diagram of input chip 115 according to one set of embodiments. The input chip 115 may include:
an input distribution unit 210;
a rate estimation unit 220;
a set of $N_I$ stream FIFOs denoted as $G(1), G(2), \ldots, G(N_I)$, wherein $N_I$ is greater than one; and
a primary scheduler 230.

A wide variety of values of other values are contemplated for the number $N_I$. In one particular embodiment, $N_I$ equals 4096.

The input distribution unit 210:
receives the composite sequence of data units from the communication medium 105;
examines each received data unit, determines the stream $X(k)$ to which the data unit belongs (e.g., based on information embedded in the header of the data unit), extracts packets from the data unit, and
stores the extracted packets into one of the stream FIFOs $G(1), G(2), \ldots, G(N_I)$, i.e., the stream FIFO that has been allocated to stream $X(k)$.

When a new stream is encountered, an available one of the stream FIFOs may be allocated to the new stream. When an existing stream is concluded, the stream FIFO that has been allocated to that stream may be deallocated and returned to the available list.

The primary scheduler 230 is configured to read packets from the stream FIFOs G(1), G(2), ..., G($N_I$) and transfer the packets to the output chips OC(1), OC(2), ..., OC($N_{OC}$). In one set of embodiments, the packets from each stream FIFO are transferred into a selected one of the output chips. The host computer 120 may provide control information which specifies a function f from the set {1, 2, ..., $N_I$} to the set {1, 2, ..., $N_{OC}$}. The packets from stream FIFO G(k), k=1, 2, ..., $N_I$, may be transferred to output chip OC(f(k)). Of course, some of the stream FIFOs may be inactive (i.e., not allocated to a stream). Thus, the domain of the function f may be a proper subset of the set {1, 2, ..., $N_I$}.

The rate estimation unit 220 may be configured to estimate the input data rate of each of the packet streams X(1), X(2), ..., X($N_S$), and, based on these data rate estimates, to generate recommended rates at which the stream FIFOs G(1), G(2), ..., G($N_I$) should be drained by the primary scheduler 230. For example, the rate estimation unit 220 may recommend rates that allow the stream FIFOs to stay nominally half full.

The rate estimation unit 220 may couple to input unit 210, local counter 213, and scheduler 230.

Figure 2C:
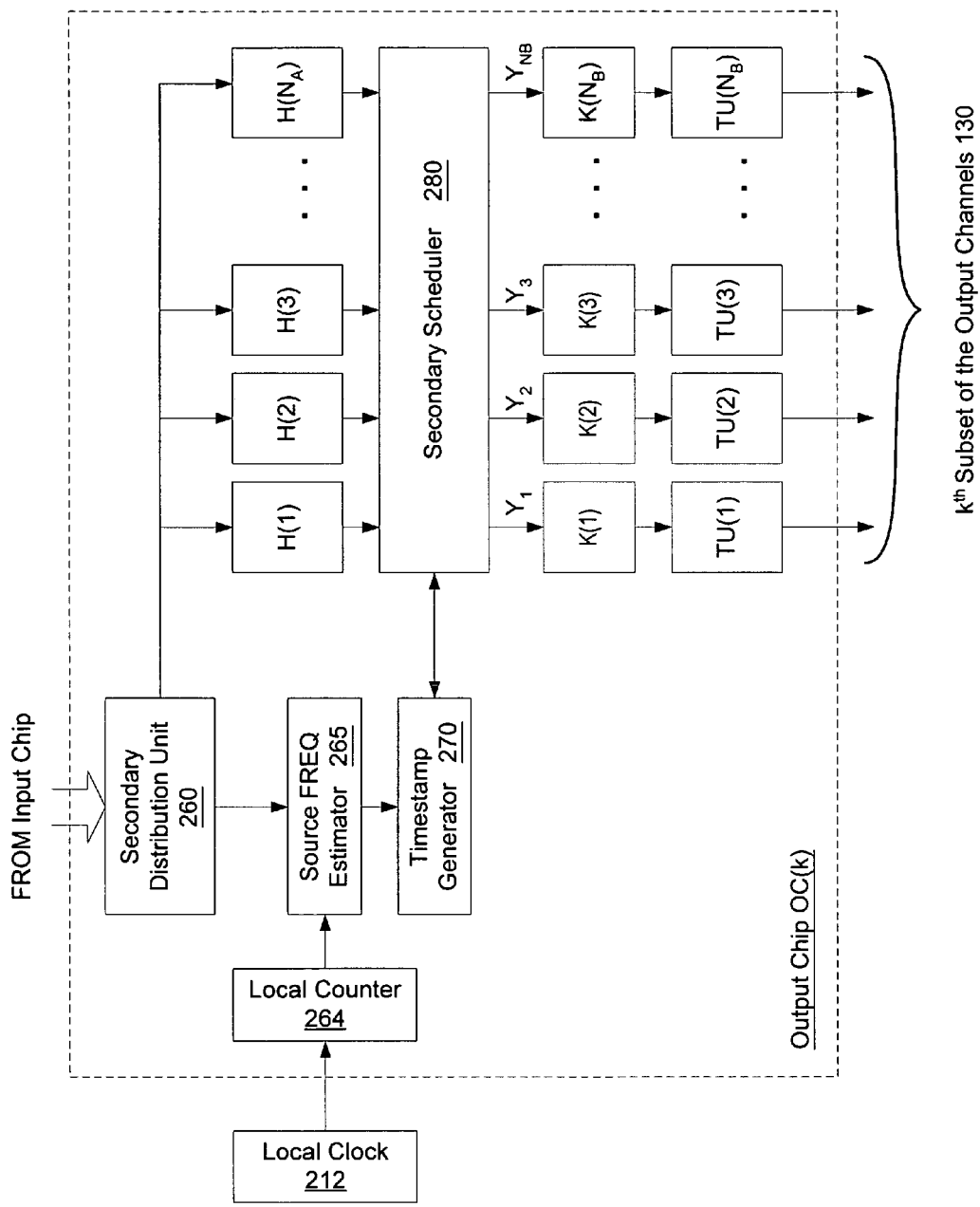
FIG. 2C illustrates one set of embodiments of an output chip of the stream multiplexer 110.

Each output chip OC(k), k=1, 2, ..., $N_{OC}$, may be configured as illustrated in FIG. 2C. Output chip OC(k) may include:
a secondary distribution unit 260;
a set of input FIFOs H(1), H(2), ..., H($N_A$), where $N_A$ is a positive integer;
a secondary scheduler 280;
a set of output FIFOs K(1), K(2), ..., K($N_B$), where $N_B$ is a positive integer;
a set of transmit unit TU(1), TU(2), ..., TU($N_B$);
a local counter 264;
a source frequency estimator 265; and
a timestamp generator 270.

Secondary distribution unit 260 receives a mixed stream of packets corresponding to one or more of the packet streams X(1), X(2), ..., X($N_S$) from the input chip 115. The secondary distribution unit 260 may examine each of the packets from the mixed stream, identify which of the packets streams the packet belongs to, and store the packet into a corresponding one of the input FIFOs H(1), H(2), ..., H($N_A$). The secondary distribution unit 260 may also examine each packet to determine if it contains a timestamp. If the packet contains a timestamp, the secondary distribution unit 260 may transfer the timestamp along with an identifier that identifies the packet stream to which to packet belongs. This identifier may be referred to herein as the "streamID".

The secondary scheduler 280 is configured to read packets from the input FIFOs H(1), H(2), ..., H($N_A$) and write the packets into the output FIFOs K(1), K(2), ..., K($N_B$). In one set of embodiments, the packets from each input FIFO are written into a selected one of the output FIFOs.

The packets written into output FIFO H(n), n=1, 2, ..., $N_B$, form an output stream $Y_n$. The transmit unit TU(n) reads the packets of output stream $Y_n$ from output FIFO H(n) and transmits the packets onto a corresponding one of the output channels. Thus, the secondary scheduler 280 generates $N_B$ output streams, and the transmit units operate to transmit the $N_B$ output streams onto $N_B$ of the output channels respectively.

A wide variety of values are contemplated for number $N_B$. In one embodiment, $N_B$=256.

The source frequency estimator 265 may be configured to track the source clock frequencies for the subset of packet streams received by output chip OC(k) from the timestamps embedded in these packet streams. Thus, the source frequency estimator 265 may maintain an estimate of the source clock frequency for each of these packet streams. These estimates are made available to the timestamp generator 270.

When the secondary scheduler 280 is ready to write a packet of stream X(k) into one of the output FIFOs, the secondary scheduler 230 may request and receive (from the timestamp generator 270) a timestamp based on the current estimate of the source clock frequency for stream X(k). The secondary scheduler 230 may replace the timestamp originally present in the packet with the new timestamp received from the timestamp generator 270 before writing the packet into the output FIFO.

In one set of embodiments, the source frequency estimator 265 may track the source clock frequencies of stream X(k) as follows.

In response to receiving each timestamp-bearing packet of the stream X(k), the source frequency estimator 265 may capture (i.e., read) the value $n_L$ of the local clock counter 264. A packet is said to be a timestamp-bearing packet if it includes a timestamp value.

Let $t_j$ denote the time of arrival of a current timestamp-bearing packet P of the stream X(k). Let $n_S$ denote the value of the timestamp in the current timestamp-bearing packet P. Let $n_L(j)$ denote the value of the local clock counter 264 captured at time of arrival $t_j$.

Let $t_{j-1}$ denote the time of arrival of a previous timestamp-bearing packet of stream X(k).

Let $n_L(j-1)$ denote the value of the local clock counter 264 captured at the time of arrival $t_{j-1}$.

Let $f_L$ denote the frequency of the local clock 212. In some embodiments, the local clock and the source clocks may have the same nominal frequency. For example, in one embodiment, the local clock and all the source clocks may have a nominal frequency of 27 MHz.

The source frequency estimator 265 may compute an estimate $\hat{n}_S(j)$ for the current timestamp value $n_S$ based on an estimate $\hat{f}_S$ of the source clock frequency of stream X(k) and a previous timestamp estimate $\hat{n}_S(j-1)$ according to the expression:

$$\hat{n}_S(j) = \hat{f}_S \cdot \frac{n_L(j) - n_L(j-1)}{f_L} + \hat{n}_S(j-1). \quad (1)$$

The division by $f_L$ may be implemented as a multiplication by local clock period $$T_L \equiv \frac{1}{f_L}.$$

The source frequency estimator 265 may compute a current timestamp error ERR(j) according to the expression $$ERR(j) = n_S - \hat{n}_S(j) \quad (2)$$

and use the current timestamp error ERR(j) to update the estimate $\hat{f}_S$ of the source clock frequency for stream X(k) as described in more detail below.

The source frequency estimator 265 may include a register PTE dedicated for storing the previous timestamp estimate $\hat{n}_S(j-1)$ and a register PLC dedicated for storing the previous local clock value $n_L(j-1)$. After having updated the frequency estimate $\hat{f}_S$, the source frequency estimator 265 may (a) store the current timestamp estimate $\hat{n}_S(j)$ into the register PTE and (b) store the current local clock value $n_L(i)$ into the register PLC, in anticipation of a next iteration. The next iteration is performed when the next timestamp-bearing packet of the stream X(k) is received.

The source frequency estimator 265 may also have registers for storing the currently received timestamp $n_S$, the frequency estimate $\hat{f}_S$, the current timestamp estimate $\hat{n}_S(j)$, and the current local counter value $\hat{n}_L(j)$.

During a startup phase for stream X(k), the host computer 120 may initialize the frequency estimate $\hat{f}_S$ to the local clock frequency $f_L$.

In one set of alternative embodiments, the source frequency estimator 265 may maintain a normalized frequency estimate $\hat{r}_S$ (instead of the frequency estimate $\hat{f}_S$) and compute the current timestamp estimate $\hat{n}_S(j)$ based on the expression:

$$\hat{n}_S(j) = \hat{r}_S \cdot [n_L(j) - n_L(j-1)] + \hat{n}_S(j-1). \tag{3}$$

This expression avoids the multiplication by $T_L$ present in expression (1), and thus, may be more efficient to implement in hardware. The current timestamp error ERR(j) may be computed according to expression (3) and used to compute an update for the normalized frequency estimate $\hat{r}_S$.

Unless otherwise stated, it will be assumed that any embodiment of the invention involving use of the frequency estimate $\hat{f}_S$ may be alternatively realized using the normalized frequency estimate instead.

FIG. 3 illustrates one embodiment of an absolute error control loop 300 which may be used to drive the absolute error, i.e., the timestamp error ERR, towards zero.

The currently received timestamp $n_S$ is provided from register 310 to summation unit 312. The current timestamp estimate $\hat{n}_S(j)$, generated by local timestamp estimator 320 according to expression (1) or expression (3), is also provided to summation unit 312.

Summation unit 312 subtracts the current timestamp estimate from the currently received timestamp in order to obtain the current absolute error ERR(j).

Filter $F_A$ operates on the current absolute error ERR(j) to determine a current output value z(j). The output value z(j) is multiplied by a constant $K_A$ and the product $K_A z(j)$ is supplied to local timestamp estimator 320.

Filter $F_A$ may be an FIR filter, an IIR filter, or a combination of FIR and IIR filters. In some alternative embodiments, filter $F_A$ may be (or may include) a nonlinear filter. It is noted that the multiplication by $K_A$ may be incorporated into the coefficients of filter $F_A$ instead of being performed after the filter $F_A$ as shown in FIG. 3.

Local timestamp estimator 320 may increase the frequency estimate $\hat{f}_S$ when the product $K_A z(j)$ is positive, and, decrease the frequency estimate $\hat{f}_S$ when the product $K_A z(j)$ is negative. For example, in one embodiment, local timestamp estimator may update the frequency estimate according to the expression $$\hat{f}_S \leftarrow \hat{f}_S + K_A z(j). \tag{4}$$

Each iteration of the absolute error control loop is invoked by the reception of a timestamp-bearing packet of the stream X(k) and may culminate with the update of the frequency estimate is $\hat{f}_S$.

The filter $F_A$ may include an internal register PZA for storing the previous filter output value z(j-1). After having computed the current output value z(j), the filter $F_A$ may store the current output value z(j) into the register PZA in anticipation of the next iteration of the absolute error control loop.

In some embodiments, filter $F_A$ and constant $K_A$ may be configured so that the absolute error ERR is slowly driven to zero.

In one set of embodiments, the filter $F_A$ is an IIR filter, where the output value z(j) is computed according to the expression $$z(j) = \alpha \cdot z(j-1) + \beta \cdot Err(j), \tag{5}$$

where $\alpha$ and $\beta$ are positive constants adding to one.

The absolute error control loop 300 may be implemented as dedicated circuitry. For example, summation unit may include an adder circuit, filter $F_A$ may include a network of adders and multipliers, and local timestamp generator may include counters and adders.

FIG. 4 illustrates one embodiment of a derivative error control loop 400 which may be used together with the absolute error control loop 300 of FIG. 3. The derivative error control loop 400 may be configured to drive the derivative error (i.e., the first discrete difference of the absolute error ERR) to zero. The absolute error control loop and the derivative error control loop may be implemented as part of source frequency estimator 265. The term "derivative error" and the term "error gradient" are used synonymously herein.

The received timestamp register 310, the summation unit 312 and the local timestamp estimator 320 may be shared between the two control loops.

The current absolute error ERR(j), computed as described above, is provided to summation unit 314 and to a delay unit D. The delay unit D provides a previous absolute error ERR(j-1) to summation unit 314.

Summation unit 314 subtracts the previous absolute ERR (j-1) from the current absolute error ERR(j) to obtain an error gradient value $\Delta$ERR, i.e., $\Delta$ERR=ERR(j)-ERR(j-1).

The error gradient $\Delta$ERR is provided to three filters denoted $F_1$, $F_2$ and $F_3$. Each filter $F_i$, i=1, 2, 3, may be an FIR filter, an IIR filter, or a combination of FIR and IIR filters. In some alternative embodiments, any or all of the filters $F_1$, $F_2$ and $F_3$ may be (or include) nonlinear filters.

The output values $z_1(j)$, $z_2(j)$ and $z_3(j)$ generated by the filters $F_1$, $F_2$ and $F_3$ respectively are supplied to three multipliers respectively. The three multipliers are configured to multiply the output values $z_1(j)$, $z_2(j)$ and $z_3(j)$ respectively by constants $K_1$, $K_2$ and $K_3$ to generate candidate values $p_1(j)$, $p_2(j)$ and $p_3(j)$, i.e., $$p_i(1) = K_i z_i(j), i=1,2,3.$$

The candidate values $p_1(j)$, $p_2(j)$ and $p_3(j)$ are provided to decision multiplexer 330.

In one alternative embodiment, the multiplication by constant $K_i$, i=1, 2, 3, may be incorporated into coefficients of filter $F_i$ instead of being performed after filter $F_i$.

Decision multiplexer 330 selects one of the candidate values $p_1(j)$, $p_2(j)$ and $p_3(j)$ depending on the value of the select line. The selected value q(j) is supplied to hard limiter 340.

The hard limiter 340 performs a limiting operation on the selected value q(j) to determine a limited value h(j). The limited value h(j) is provided to a multiplier. The multiplier multiplies the limited value h(j) by a constant $K_0$ to produce a clock adjustment value $w(j)=K_0 h(j)$. The clock adjustment value $w(j)$ is provided to local timestamp estimator 320.

Local timestamp estimator 320 updates the source clock frequency estimate $\hat{f}_S$ based on the clock adjustment value $w(j)$. For example, in one embodiment, the local timestamp estimator 320 updates the source clock frequency estimate according to the expression:

$$\hat{f}_S \leftarrow \hat{f}_S + w(j). \tag{6}$$

Each iteration of the derivative error control loop is invoked by the reception of a timestamp-bearing packet of the stream $X(k)$ and may culminate with an update of the frequency estimate $\hat{f}_S$. All three filters $F_1$, $F_2$ and $F_3$ may be updated during each iteration of the derivative error control loop 400.

In one set of embodiments, each filter $F_i$, $i=1, 2, 3$, is an IIR filter having the structure:

$$z_i(j)=\alpha_i \cdot z_i(j-1)+\beta_i \cdot \Delta Err. \tag{7}$$

Decision multiplexer 330 selects one of the candidate values $p_1(j)$, $p_2(j)$ and $p_3(j)$ depending on the value of the select line. The select line is controlled by a state machine 335 that lives in one of three states $S_1$, $S_2$ or $S_3$. In the state $S_i$, $i=1, 2, 3$, the state machine drives the select line with a value $V_i$ that induces decision multiplexer 330 to select the candidate value $p_i(j)$. The state machine counts the number of timestamp-bearing packets that have been received in stream $X(k)$ and compares the count value to threshold values $N_{12}$ and $N_{23}$, where $N_{12}<N_{23}$, to determine when to transition between states. When the stream $X(k)$ is being initialized, the count value may be set to zero and the state may be initialized to $S_1$. When the count value reaches (or exceeds) $N_{12}$, the state machine transitions to state $S_2$. When the count value reaches (or exceeds) $N_{23}$, the state machine transitions to state $S_3$.

Filter $F_1$ may be tuned for fast tracking into order to perform initial acquisition; filter $F_2$ may be tuned for intermediate speed tracking; and filter $F_3$ may be tuned for slow tracking so as to be most immune to variations in the $ERR(j)$ signal due to jitter, but still fast enough to track clock drift. The value $N_{12}$ is set to value that allows sufficient time for the filter $F_1$ to acquire the source clock frequency signal within an error $e_1$. The value $N_{23}$ may be set to a value that allows sufficient time for the filter $F_2$ to acquire the source clock frequency signal within an error $e_2$. The hard limiter may limit the selected value $q(j)$ to the interval $[-c_1,c_1]$ during state $S_1$, to the interval $[-c_2,c_2]$ during state $S_2$, and to the interval $[-c_3,c_3]$ during state $S_3$, where constants $c_1$, $c_2$ and $c_3$ satisfy:

$$0<c_3<c_2<c_1.$$

In other words, in state $S_i$, $i=1, 2, 3$, the hard limiter computes the limited value $h(j)$ based on the expression:

$$h(j) = \begin{cases} -c_i, & \text{if } q(j) \leq -c_i \\ q(j), & \text{if } -c_i < q(j) < c_i \\ c_i, & \text{if } c_i \leq q(j) \end{cases}. \tag{8}$$

The hard limiter may receive the select line (i.e., the same select line that is supplied to the decision multiplexer 330) from the state machine so that it can apply the appropriate limiting range in each state. The notation $[A,B]$ denotes the closed interval from A to B.

As described above, each iteration of the derivative error control loop involves making an adjustment to the estimate $\hat{f}_S$ of the source clock frequency for the stream $X(k)$. The frequency estimate $\hat{f}_S$ is used to restamp timestamp-bearing packets of stream $X(k)$ as they are transmitted onto an output channel. If the adjustments to the frequency estimate are too large (i.e. too much jitter), the PLL at the decoder (e.g., MPEG-2 decoder) may lose its lock on the estimated source clock frequency. Thus, it is beneficial to impose a bound on the magnitude of the frequency adjustment. The hard limiter performs this bounding function. The constant $c_1$ is chosen to ensure that the output clock jitter is within what the decoder's PLL can handle (e.g., 500 ns jitter).

In addition, the hard limiter may serve as a lock failure detector. If the selected value $q(j)$ exceeds the bound given by constant $c_i$ in state $S_i$, the hard limiter may (a) declare a loss of lock (e.g., by asserting an interrupt to the host computer) and (b) reset the absolute error control loop and the derivative error control loop by re-initializing the state to $S_1$ and resetting $ERR(j)$ to zero, and $\hat{n}_S(j)=n_S(j)$.

While the example of the derivative error control loop described above includes three filters and three corresponding states, other embodiments are contemplated with more or less than three filters (and corresponding states).

While the example of the derivative error control loop described above in connection with FIG. 4 includes a hard limiter, other embodiments are contemplated where the hard limiter is replaced with a limiter having a smooth (or continuous) input-output relation.

In response to a timestamp request from the secondary scheduler 280, the timestamp generator 270 may read a current value $CV_L$ of the local clock counter 264 and generate a timestamp according to the relation:

$$\text{Timestamp} = \hat{f}_S \cdot \frac{CV_L - n_L(j-1)}{f_L} + \hat{n}_S(j-1), \tag{9}$$

where $\hat{n}_S(j-1)$ represents the timestamp estimate generated by the local timestamp estimator 320 at the time of the most recent frequency estimation iteration, where $n_L(j-1)$ is the value of the local clock counter 264 captured at the time of most recent frequency estimation iteration. In an alternative embodiment that estimates normalized frequency, the timestamp generator 270 may generate the timestamp according to the relation:

$$\text{Timestamp}=\hat{f}_S \cdot [CV_L - n_L(j-1)] + \hat{n}_S(j-1). \tag{10}$$

The timestamp is provided to the secondary scheduler 280 so that the secondary scheduler may restamp a timestamp bearing packet of the packet stream $X(k)$.

In one set of embodiments, a system may include a timestamp estimator, a summation unit, and a filter $F_A$, e.g., as illustrated in FIG. 3.

The timestamp estimator is configured to generate a current timestamp estimate based on an estimate of a source clock frequency associated with a packet stream.

The summation unit is configured to receive (a) a current received timestamp of the packet stream and (b) the current timestamp estimate, and to compute a current error equal to a difference of the current received timestamp and the current timestamp estimate.

The filter $F_A$ is configured to filter the current error to obtain a filter output z.

The timestamp estimator is further configured to compute a first update of the estimate of the source clock frequency based on the filter output value z.

The estimate of the source clock frequency is usable to restamp at least a subset of the packets of the packet stream.

In one embodiment, the system may also include a second summation unit, a set of filters $F_1, F_2, \ldots, F_M$, and a decision multiplexer, e.g., as suggested in FIG. 4. The case M=3 is illustrated in FIG. 4. However, in general, M may be any integer greater than one.

The second summation unit is configured to receive the current error and a previous error, and to compute an error gradient equal to a difference of the current error and the previous error.

The set of filters $F_1, F_2, \ldots, F_M$ is configured to receive the error gradient and to filter the error gradient to obtain a corresponding filter output value $z_i$.

The decision multiplexer is configured to select each of the filter output values $z_1, z_2, \ldots, z_M$ during respective periods of time.

The timestamp estimator is configured to compute a second update to the estimate of the source clock frequency using the selected filter output value. The second update to the source clock frequency estimate may be arranged so as to drive the error gradient towards zero.

The filters $F_1, F_2, \ldots, F_M$ may be ordered according to tracking speed. The decision multiplexer may be configured to select the filter output values during the respective periods of time in response to a select input from a state machine. The state machine drives the decision multiplexer to select the filter output values from the filters $F_1, F_2, \ldots, F_M$ in order from fastest tracking speed to slowest tracking speed.

In some embodiments, the system may also include a state machine configured to count a number of timestamp-bearing packets in the packet stream, to compare the count to an ordered set of threshold values, and to drive the decision multiplexer to select one of the filter output values based on a state of the count relative to the set of threshold values.

A limiter may be employed to limit the selected filter output value to an amplitude range. The size of the amplitude range may decrease in discrete steps corresponding to said respective periods of time.

A multiplier may be configured to scale the selected filter output value. The scaled value is used to perform the second update of the source clock frequency estimate.

In one group of embodiments, the packet stream is an MPEG-2 transport stream, and, the timestamps are program clock reference (PCR) timestamps.

The filter $F_A$ may be an infinite impulse response (IIR) filter. Other types of filters are contemplated as well.

Any or all of the filters of set $\{F_1, F_2, \ldots, F_M\}$ may be IIR filters. Other types of filters are contemplated as well.

In one embodiment, the estimate for the source clock frequency is a normalized estimate for the source clock frequency, as described above.

The system may also include a scheduler (e.g., a scheduler such as the secondary scheduler of FIG. 2C) configured to restamp at least a subset of the packets of the packet stream based on said estimate of the source clock frequency.

Figure 5:
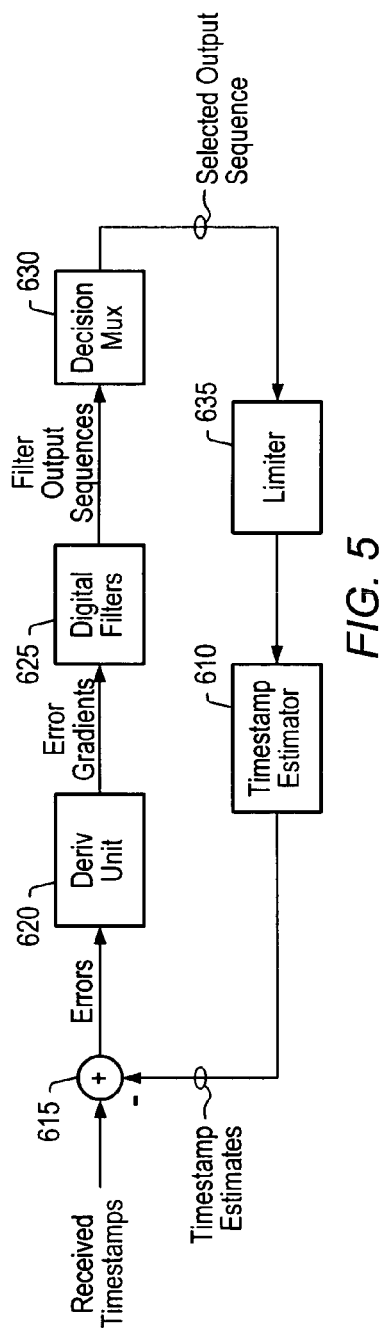
FIG. 5 illustrates one set of embodiments of a control system including a derivative unit, a set of digital filters, a decision multiplexer, optionally a limiter, and a timestamp estimator.

In another set of embodiments, a system may include a timestamp estimator 610, a summation unit 615, a derivative unit 620, two or more digital filters 625 and a multiplexer 630, e.g., as illustrated in FIG. 5.

The timestamp estimator 610 is configured to generate a sequence of timestamp estimates based on corresponding sequence of estimates for a frequency of a source clock associated with a packet stream.

The summation unit 615 is configured to operate on (a) a sequence of received timestamps extracted from packets of the packet stream and (b) the sequence of timestamp estimates to generate a sequence of error values, wherein each of the error values is a difference between one of the received timestamps and a corresponding one of the timestamp estimates.

The derivative unit 620 is configured to operate on the sequence of error values to generate a sequence of error gradients. For example, the derivative unit may include a summation circuit and a delay unit.

The two or more digital filter circuits 625 are configured to filter the sequence of error gradients to generate respectively two or more sequences of filter output values.

The multiplexer 630 is configured to select one of the two or more sequences of filter output values, wherein different ones of the two or more sequences are selected during different periods of time.

The timestamp estimator is configured to generate the sequence of frequency estimates based on the selected sequence of filter output values.

The sequence of frequency estimates is usable to restamp at least a subset of the packets of the packet stream.

The packet stream may be an MPEG-2 transport stream, and, the timestamps may be program clock reference (PCR) timestamps.

The two or more digital filters may be IIR filters.

In one embodiment, said estimate for the source clock frequency is a normalized estimate for the source clock frequency, as described above.

The system may include a limiter 635 to the limit the values of the selected output sequence. The limited values may then be used to generate the sequence of frequency estimates.

The system may also include a scheduler configured to restamp at least a subset of the packets of the packet stream based on said estimates of the source clock frequency.

The update to the source clock frequency estimate may be configured to drive the error gradient towards zero.

Figure 6:
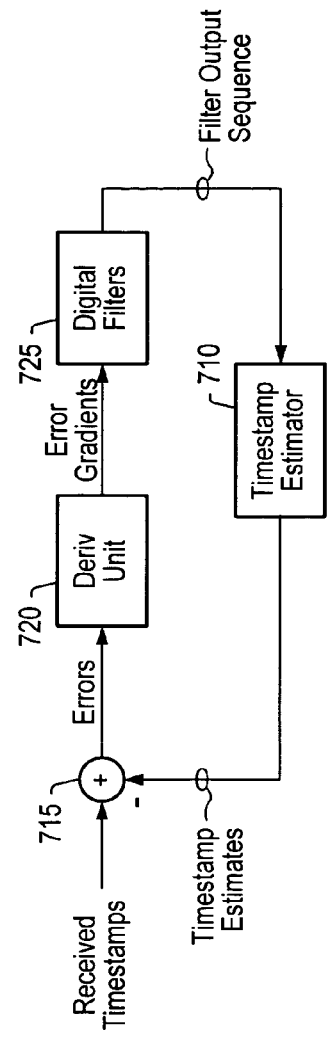
FIG. 6 illustrates one set of embodiments of a control system including a derivative unit, a digital filter, and a timestamp estimator.

In yet another set of embodiments, a system may include a timestamp estimator 710, a summation unit 715, a derivative unit 720, and a digital filter circuit 725, e.g., as illustrated in FIG. 6.

The timestamp estimator 710 is configured to generate a sequence of timestamp estimates based on corresponding sequence of estimates for a frequency of a source clock associated with a packet stream.

The summation unit 715 is configured to operate on (a) a sequence of received timestamps extracted from packets of the packet stream and (b) the sequence of timestamp estimates to generate a sequence of error values, wherein each of the error values is a difference between one of the received timestamps and a corresponding one of the timestamp estimates.

The derivative unit 720 configured to operate on the sequence of error values to generate a sequence of error gradients. The derivative unit may include a summation circuit (e.g., an adder) and a delay unit.

The digital filter circuit 725 is configured to filter the sequence of error gradients to generate a sequence of filter output values.

The timestamp estimator is configured to generate said sequence of frequency estimates based on the sequence of filter output values.

Optimizations for MPEG-2

In one set of embodiments, the multiplexer 110 may be configured to multiplex MPEG-2 transport streams. In one embodiment of this set, the absolute error control loop and the derivative error control loop are configured so that:

$F_A$ is an IIR filter with $\alpha=63/64$, $\beta=1/64$;
$K_A=1/1024$;
$F_1$ is an IIR filter with $\alpha_1=15/16$, $\beta_1=1/16$
$K_1=1/16$;
$F_2$ is an IIR filter with $\alpha_2=63/64$, $\beta_2=1/64$;
$K_2=1/64$;
$F_3$ is an IIR filter with $\alpha_3=255/256$, $\beta_3=1/256$;
$K_3=1/256$;
$N_{12}=50$ and $N_{23}=250$; and
$c_1=12$, $c_2=3$ and $c_3=0.3$.

If the multiplication by $K_A$ is incorporated into the IIR coefficients of filter $F_A$ (instead of being performed after the filter $F_A$), the coefficients of filter $F_A$ may be:

$\alpha=63/65536$, $\beta=1/65536$.

Similarly, the constants $K_1$, $K_2$ and $K_3$ may also be incorporated into the coefficients of filters $F_1$, $F_2$ and $F_3$, respectively. For this embodiment, the absolute error control loop includes:
3 additions including the addition at summation unit 312, the addition in IIR filter $F_A$ and the addition in expression (4); and
3 multiplications including the two multiplications in filter $F_A$ and the multiplication by constant $K_A$.

Furthermore, the derivative error control loop includes:
6 additions including the addition at summation unit 314, the addition in each of filter $F_1$, $F_2$ and $F_3$, the addition to count timestamp-bearing packets in state machine 335, and the addition in expression (6);
10 multiplications including the two multiplications in each of filters $F_1$, $F_2$ and $F_3$, the multiplications by $K_1$, $K_2$ and $K_3$, and the multiplication by $K_0$;
logic for the state machine 335;
logic for the decision multiplexer 330; and
logic for the hard limiter 340.

In total, the two control loops include:
8 additions (since the adder 312 is shared between the two loops);
13 multiplications;
logic for the state machine 335;
logic for the decision multiplexer 330; and
logic for the hard limiter 340.

Many of the multiplications are simply scaling by powers of two, and thus, may be implemented by left or right shifting. As noted above, the scaling factors $K_A$, $K_1$, $K_2$, and $K_3$ may be embedded into their respective IIR filter coefficients, reducing the number of multiplications to 9. It is also possible to embed scaling factor $K_0$ into the coefficients of filters $F_1$, $F_2$ and $F_3$. However, doing so may disrupt the power of two property of many of the coefficients and potentially result in greater complexity.

Due to the use of IIR filters, the memory constraints of the control loops are minimal. In addition to the received timestamp value, the control loop requires storage for the following:

| | |
|---|---|
| state of state machine 335 | (2 bits) |
| ERR(j − 1) | (13.13 bits + sign) |
| previous filter output z(j − 1) | (0.12 bits + sign) |
| previous filter output $z_1$(j − 1) | (9.0 bits + sign) |
| previous filter output $z_2$(j − 1) | (7.5 bits + sign) |
| previous filter output $z_3$(j − 1) | (9.8 bits + sign) |
| frequency estimate $f_S$ | (13.24 bits + sign) |
| filter $F_A$ coefficients | (2 * 16 bits) |
| filter $F_1$ coefficients | (2 * 8 bits) |
| filter $F_2$ coefficients | (2 * 12 bits) |

-continued

| | |
|---|---|
| filter $F_3$ coefficients | (2 * 16 bits) |
| state machine count value | (10 bits) |
| constants $c_1$, $c_2$ and $c_3$ | (3 * 4 bits) |
| $K_0$ scaling factor | (12 bits) |

In total, the two control loops may include 259 bits of storage. Note that the filter coefficients (104 bits) for the four filters $F_A$, $F_1$, $F_2$ and $F_3$, are identical for every stream $X(1)$, $X(2)$, ..., $X(N_S)$, and thus, one 104 bit storage unit suffices for all streams. In addition, the scaling factor $K_0$ and the constants $c_1$, $c_2$, and $c_3$ are shared among all streams (24 bits). The notation "p.q+sign" indicates a binary word having p bits before the binary point, q bits after the binary point, and one sign bit.

CONCLUSION

Various modifications and changes may be made to the embodiments described herein as would be obvious to a person skilled in the art having the benefit of this disclosure. It is intended that the invention embrace all such modifications and changes and, accordingly, the above description is to be regarded in an illustrative rather than a restrictive sense

What is claimed is:

1. A system comprising:
a timestamp estimator configured to generate a current timestamp estimate based on an estimate of a source clock frequency associated with a packet stream;
a summation unit configured to receive (a) a current received timestamp of the packet stream and (b) the current timestamp estimate, and to compute a current error equal to a difference of the current received timestamp and the current timestamp estimate;
a filter $F_A$ configured to filter the current error to obtain a filter output z;
wherein the timestamp estimator is further configured to compute a first update of the estimate of the source clock frequency based on the filter output value z;
wherein the estimate of the source clock frequency is used to restamp at least a subset of the packets of the packet stream.

2. The system of claim 1 further comprising:
a second summation unit configured to receive the current error and a previous error, and to compute an error gradient equal to a difference of the current error and the previous error;
a set of filters $F_1$, $F_2$, ..., $F_M$ in addition to the filter $F_A$, wherein M is an integer greater than one, wherein each filter $F_i$, i=1, 2, ..., M, of said set is configured to receive the error gradient and to filter the error gradient to obtain a corresponding filter output value $z_i$;
a decision multiplexer configured to select each of the filter output values $z_1$, $z_2$, ..., $z_M$ during respective periods of time;
wherein the timestamp estimator is configured to compute a second update to the estimate of the source clock frequency using the selected filter output value.

3. The system of claim 2, wherein the second update to the source clock frequency estimate serves to drive the error gradient towards zero.

4. The system of claim 2, wherein the filters $F_1$, $F_2$, ..., $F_M$ are ordered according to tracking speed, wherein the decision multiplexer is configured to select the filter output values during the respective periods of time in response to a select input from a state machine, wherein the state machine drives the decision multiplexer to select the filter output values from the filters $F_1, F_2, \ldots, F_M$ in order from fastest tracking speed to slowest tracking speed.

5. The system of claim 2 further comprising a state machine configured to count a number of timestamp-bearing packets in the packet stream, to compare the count to an ordered set of threshold values, and to drive the decision multiplexer to select one of the filter output values based on a state of the count relative to the set of threshold values.

6. The system of claim 2 further comprising a limiter configured to limit the selected filter output value to an amplitude range.

7. The system of claim 6, wherein the size of the amplitude range decreases in discrete steps corresponding to said respective periods of time.

8. The system of claim 2 further comprising a multiplier configured to scale the selected filter output value, wherein the scaled value is used to perform the second update of the source clock frequency estimate.

9. The system of claim 1, wherein the packet stream is an MPEG-2 transport stream, wherein the timestamps are program clock reference (PCR) timestamps.

10. The system of claim 1, wherein the filter $F_A$ is an infinite impulse response (IIR) filter.

11. The system of claim 1, wherein the filters of said set of filters are IIR filters.

12. The system of claim 1, wherein said estimate for the source clock frequency is a normalized estimate for the source clock frequency.

13. The system of claim 1 further comprising a scheduler configured to restamp at least a subset of the packets of the packet stream based on said estimate of the source clock frequency.

14. A system comprising:
a timestamp estimator configured to generate a sequence of timestamp estimates based on corresponding sequence of estimates for a frequency of a source clock associated with a packet stream;
a summation unit configured to operate on (a) a sequence of received timestamps extracted from packets of the packet stream and (b) the sequence of timestamp estimates to generate a sequence of error values, wherein each of the error values is a difference between one of the received timestamps and a corresponding one of the timestamp estimates;
a derivative unit configured to operate on the sequence of error values to generate a sequence of error gradients;
two or more digital filter circuits configured to filter the sequence of error gradients to generate respectively two or more sequences of filter output values;
a multiplexer configured to select one of the two or more sequences of filter output values, wherein different ones of the two or more sequences are selected during different periods of time;
wherein the timestamp estimator is configured to generate said sequence of frequency estimates based on the selected sequence of filter output values.

15. The system of claim 14, wherein the sequence of frequency estimates is usable to restamp at least a subset of the packets of the packet stream.

16. The system of claim 14, wherein the packet stream is an MPEG-2 transport stream, wherein the timestamps are program clock reference (PCR) timestamps.

17. The system of claim 14, wherein the two or more digital filters are IIR filters.

18. The system of claim 14, wherein said estimate for the source clock frequency is a normalized estimate for the source clock frequency.

19. The system of claim 14 further comprising a scheduler configured to restamp at least a subset of the packets of the packet stream based on said estimates of the source clock frequency.

20. The system of claim 14, wherein the update to the source clock frequency estimate serves to drive the error gradient towards zero.

21. A system comprising:
a timestamp estimator configured to generate a sequence of timestamp estimates based on corresponding sequence of estimates for a frequency of a source clock associated with a packet stream;
a summation unit configured to operate on (a) a sequence of received timestamps extracted from packets of the packet stream and (b) the sequence of timestamp estimates to generate a sequence of error values, wherein each of the error values is a difference between one of the received timestamps and a corresponding one of the timestamp estimates;
a derivative unit configured to operate on the sequence of error values to generate a sequence of error gradients;
a digital filter circuit configured to filter the sequence of error gradients to generate a sequence of filter output values;
wherein the timestamp estimator is configured to generate said sequence of frequency estimates based on the sequence of filter output values.

* * * * *